(12) United States Patent
Abt et al.

(10) Patent No.: US 6,907,583 B2
(45) Date of Patent: Jun. 14, 2005

(54) COMPUTER AIDED METHOD OF CIRCUIT EXTRACTION

(75) Inventors: Jason Abt, Kanata (CA); Thomas Kapler, Ottawa (CA); Stephen Begg, Ottawa (CA)

(73) Assignee: Semiconductor Insights, Inc., Ontario (CA)

( * ) Notice: Subject to any disclaimer, the term of this patent is extended or adjusted under 35 U.S.C. 154(b) by 0 days.

(21) Appl. No.: 10/267,994

(22) Filed: Oct. 10, 2002

(65) Prior Publication Data

US 2003/0084409 A1 May 1, 2003

(30) Foreign Application Priority Data

Oct. 12, 2001 (CA) .............................................. 2358729

(51) Int. Cl.[7] .............................................. G06F 17/50
(52) U.S. Cl. ................................... 716/1; 716/7; 716/8
(58) Field of Search .................................. 716/1, 7, 8

(56) References Cited

U.S. PATENT DOCUMENTS

| | | | | |
|---|---|---|---|---|
| 4,791,586 A | * | 12/1988 | Maeda et al. ................... 716/5 |
| 4,835,704 A | * | 5/1989 | Eichelberger et al. ......... 716/21 |
| 5,086,477 A | | 2/1992 | Yu et al. ........................ 382/8 |
| 5,191,213 A | | 3/1993 | Ahmed et al. ............... 250/310 |
| 5,210,699 A | | 5/1993 | Harrington ...................... 716/5 |
| 5,384,710 A | | 1/1995 | Lam et al. ..................... 716/11 |
| 5,490,095 A | | 2/1996 | Shimada et al. ................ 716/5 |
| 5,572,437 A | | 11/1996 | Rostoker et al. ............. 716/16 |
| 5,629,858 A | | 5/1997 | Kundu et al. ................... 716/1 |
| 5,999,726 A | | 12/1999 | Ho .......................... 395/500.6 |
| 6,236,746 B1 | | 5/2001 | Chamberlain et al. ...... 382/145 |
| 6,499,129 B1 | | 12/2002 | Srinivasan et al. ............. 716/4 |

OTHER PUBLICATIONS

Li et al., *Layout Extraction and Verification Methodology for CMOS I/O Circuits*, Design Automation Conference, Proceedings, Jun. 15–19, 1998, pp. 291–296.
U.S. Appl. No. 09/920,843, filed Aug. 3, 2001, Ioudovski.
U.S. Appl. No. 09/920,734, filed Aug. 3, 2001, Gont et al.
Boehner, *Logex—An Automatic Logic Extractor from Transistor to Gate Level for CMOS Technology*, 25[th]ADM/IEEE Design Automation Conference, 1988 IEEE, Paper 34.2, pp. 517–522.
Dukes et al., *A Generalized Extraction System for VLSI*, ASIC Conference and Exhibit, Proceedings, Fourth Annual IEEE International, Sep. 23–27, 1991, pp. P4–8.1–P4–8.4.
Hüber et al., *Efficient Partitioning and Analysis of Digital CMOS–Circuits*, 1992 IEEE, pp. 280–283.
"Schematic Design Tools—User's Guide," 1992, OrCAD, pp. 82–93.
"Schematic Design Tools—Reference Guide," 1992, OrCAD, pp. 304–315.
"PC Board Layout Tool 386+ User's Guide," 1992, OrCAD, pp. 18–31.

* cited by examiner

*Primary Examiner*—A. M. Thompson
*Assistant Examiner*—James Sun Lin
(74) *Attorney, Agent, or Firm*—Sterne, Kessler, Goldstein & Fox P.L.L.C.

(57) ABSTRACT

A method and apparatus for extracting circuit design information from a pre-existing semiconductor integrated circuit (IC) or at least a portion thereof is described. It includes imaging at least a portion of two or more physical layers of the pre-existing IC to obtain stored electronic images of the physical IC layers, converting the stored electronic images of the physical IC layers to a vector format data, horizontally and vertically aligning the vector format data of the electronic stored images of the physical IC layers, and providing a multi-layer display of the aligned vector format data. A net-list or schematic is generated from the multi-layer display of the vector format data. The net-list and/or schematic may be generated as a number of individual pages by providing a template of circuit elements and placing a circuit element over a portion of the display corresponding to the circuit element. The template of circuit elements may include transistors, logic gates or complex circuit blocks. The vector format data may be altered to correct errors in the images or manipulated to correct the alignment of the images. In addition, the schematic may be traced to the image of the physical IC layer.

21 Claims, 12 Drawing Sheets

COMPUTER AIDED METHOD OF CIRCUIT EXTRACTION

This application claims the benefit of the Canadian Patent Application Ser. No. 2,358,729, filed on Oct. 12, 2001.

FIELD OF THE INVENTION

The invention relates generally to circuit extraction from integrated circuits, and more particularly to the computer aided extraction of circuits.

BACKGROUND OF THE INVENTION

In the intensely competitive field of microelectronics, detailed analysis of a semiconductor integrated circuit product can provide valuable information as to how a particular technical problem was dealt with, overall strengths and weaknesses of a design approach, and other relevant information. This information can be used to make decisions regarding market positioning, future designs and new product development. The information resulting from the analysis of a product is typically provided through circuit extraction or reverse engineering, functional analysis and other technical means. At the core of this activity is the process of design analysis which, in this context, refers to the techniques and methodology of deriving complete or partial schematics, starting with essentially any type of integrated circuit in any process technology. For such technical information to be of strategic value it must be accurate and cost-effective, and it is very important that the information should be timely.

Most microelectronic devices are constructed using various metal layers interconnected over a bed of silicon, which contains transistors, capacitors, resistors, and other electronic components.

Currently, reverse engineering techniques employed in areas such as circuit analysis rely on manual circuit extraction. Methods of extracting circuits from existing layouts that are known in the industry, an example of which is described in U.S. Pat. Ser. No. 6,236,746 which issued to Chamberlain et al.

A circuit extraction process typically involves skilled engineers manually extracting circuit information by performing the following sequential tasks:
1. De-capping the chip containing the desired circuit.
2. Removing individual metal or polysilicon layers in order to expose each layer for imaging.
3. Capturing individual images of metal or polysilicon using film or digital camera, a SEM or an X-ray camera.
4. Creating photomosaics by physically connecting (usually taping) the images together in such a manner as to maintain image consistency.
5. Extracting circuits composed of tracing metal lines down to a base layer, identifying circuit elements, and connecting the elements in a connectivity network.
6. Organizing schematics.
7. Capturing schematics using a software tool or on paper for report production.

Due to the inherent manual intervention in the system, errors in connectivity and 'signal line' flow between separate images can occur. Other errors due to photographic lens topology sometimes skewing the ends of the images add to the possibility of errors in the creation of photomosaics that are exact representations of the physical circuit layout. The separate overlaying layers are traced onto a base underlying layer, such as polysilicon or metal. Upon successful completion of connectivity tracing, the circuit extraction process begins.

Once the photomosaic has been assembled, a skilled technician, familiar with the layout of semiconductor devices in silicon, examines the device and records the connection between the electronic components. The connection between circuits or 'signal-lines' are documented and given names to indicate location on the images as well as what circuit is connected to it. This information is then recorded as a 'net-list'. A technician will also recognize basic building blocks such as NAND gates or inverters and create a detailed circuit diagram. This process generally creates multiple pages of schematics. The connectivity between these pages is usually kept separate, where inputs and outputs of signals are tracked. The engineer also follows naming conventions for identifying blocks, associated circuits and individual gates.

Quite often, while in the process of analyzing circuits to determine functionality, it is found that some components should not be included in the circuit pages for which they were originally characterized. When performing this analysis on a large device, these changes and amendments to the schematics become complicated and unmanageable, as well, if not recorded properly they may also add errors to the final report. Because current methods rely on manual circuit extraction, small mistakes can occur in connectivity between individual transistors, gates, or circuit blocks. Returning to the appropriate photomosaic can be difficult unless strict naming standards of blocks, associated circuits and individual gates, are kept. Due to the ever increasing complexity of modern circuits, this process can be very time consuming and is prone to human error.

Circuit extraction through electronic image recognition, as described in U.S. Pat. Ser. No. 5,086,477 which issued to Yu et al. rely on an automated method of extracting circuits by representing the image in a digitized form. The system identifies every unique cell and/or gate used in the integrated circuit. A unique abstract representation is created for each of the unique cells or gates, which are stored in a library. The system requires user intervention to determine the boundary of the underlying cell or gate. The system then attempts to associate and match all abstract features contained in the layout database to the cells in the reference library using classical template matching. However, the method is limited to gate-array or very structured standard cell integrated circuit analysis in which a large majority of the cells are identical. It is therefore inefficient for analysis of modern Application Specific Integrated Circuits (ASIC) or custom integrated circuits, which contain a large number of unique cells and/or gates. The extraction process further creates problems because the computer does not recognize the location of the extracted circuit; therefore, the net-lists are generated in a random fashion, and circuit blocks do not follow standard logic. Net-lists become complicated and unmanageable in large-scale projects.

Tools such as Cadence or Viewlogic introduce an electronic management of circuits, but successful schematic organization is still non-trivial. Often times, an engineer requires a double check of schematics against images. Knowing where each gate is vs. the appropriate photomosaic is time consuming, especially when dealing with circuits having 10,000+ logic gates as in microprocessors. The tools that are used have been adapted from circuit design tools, and are not designed for working backwards for the purposes of reverse engineering.

Other methods as those described in U.S. Pat. Ser. No. 5,999,726 which issued to Ho generate net-lists of components and reconnect these as circuit diagrams. However, these methods have similar problems in that the net-lists generated become overwhelmingly large, and traceability between schematics and their source images is not addressed.

When confronted with these issues, it becomes apparent that a tool is necessary for keeping track of circuit schematics against circuit gates on the appropriate photomosaics or SEM images. Recent advances in SEM capturing techniques have allowed for mosaic accuracy beyond optical photography. Most images are easily aligned and require very small interaction from the user; however, some interaction is still necessary. The necessity of interaction comes not only from the alignment issues but also from de-processing technologies. Although the process of removing metal layers is fairly standard, new manufacturing techniques constantly introduce new variables, and the de-processing of layers can sometimes cause problems such as over-etching and loss of data. To the user, most of these problems are easily recognizable.

Therefore, there is a need for a process and apparatus that will provide connectivity between the extracted circuits and the images from which they have been extracted. There is a further need for a method and apparatus that will allow for minor variations to be made in extracted circuit topology to correct mistakes due to process or acquisition errors.

SUMMARY OF THE INVENTION

The invention is directed to a method and apparatus for extracting circuit design information from a pre-existing semiconductor integrated circuit (IC) or at least a portion thereof. The invention includes imaging at least a portion of two or more physical layers of the pre-existing IC to obtain stored electronic images of the physical IC layers, converting the stored electronic images of the physical IC layers to a vector format, horizontally and vertically aligning the vector format data of the electronic images of the physical IC layers, and providing a multi-layer display of the aligned vector data.

In accordance with a further aspect of this invention, the invention further includes generating a net-list or schematic from the multi-layer display of the vector data.

In accordance with another aspect of the invention, each electronic stored image comprises two or more discrete overlapping images stitched together to form an image of the physical IC layer.

With regard to a further aspect of the invention, the netlist and/or schematic may be generated by providing a template of circuit elements and placing a circuit element over a portion of the display corresponding to the circuit element. The template of circuit elements may include transistors, logic gates or complex circuit blocks.

In accordance with another aspect of the invention, the vector data may be altered to correct errors in the images or manipulated to correct the alignment of the images. In addition, the schematic may be traced to the image of the physical IC layer.

In accordance with a further aspect of the invention, the net-list or schematic may be generated as a number of individual pages.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 1:
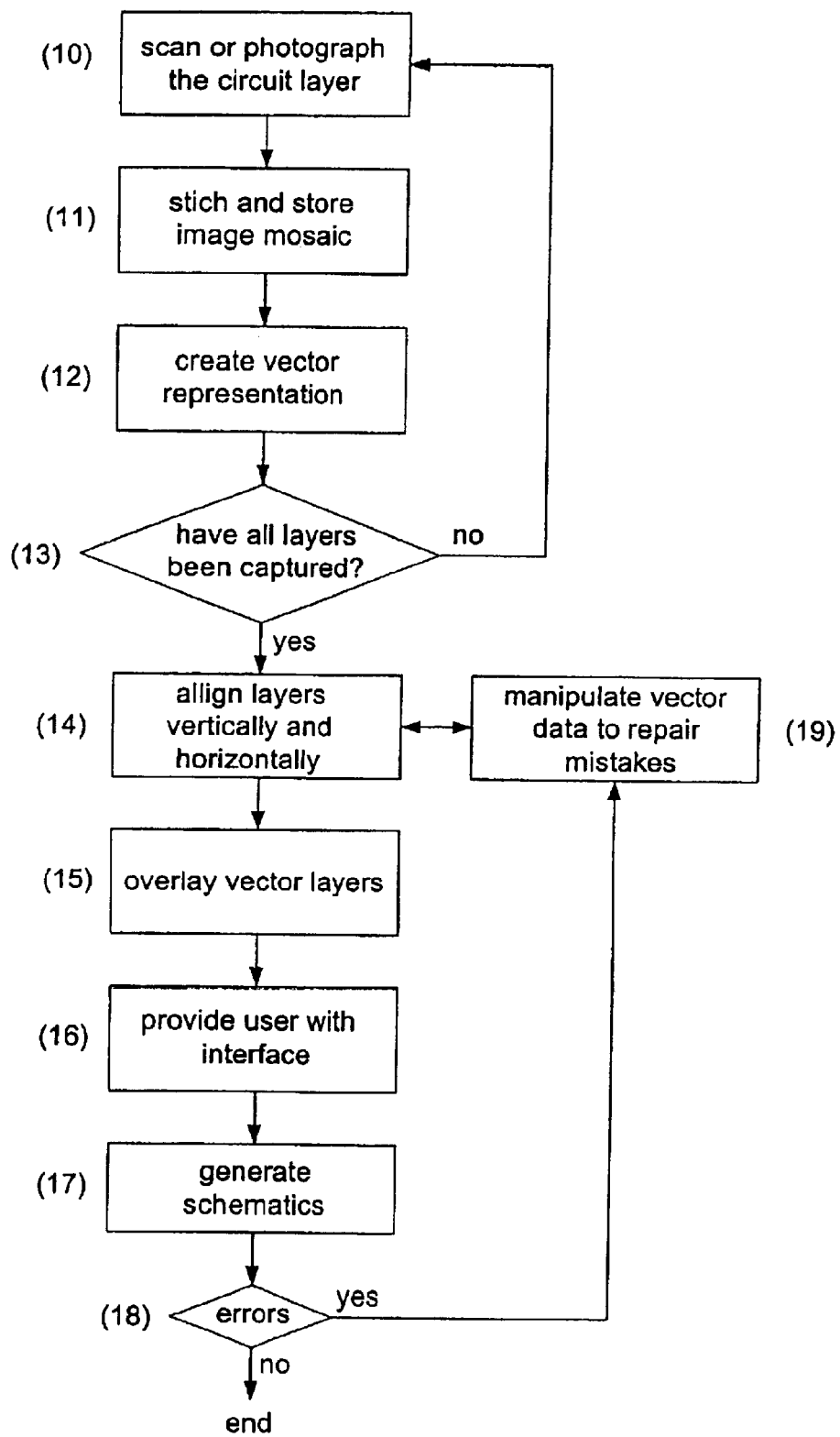
FIG. 1 is a flow chart illustrating the present invention.

The method of analyzing an integrated circuit in accordance the present invention will be described in conjunction with the flow chart illustrated in FIG. 1 and the apparatus 20 schematically illustrated in FIG. 2. As in previous methods, the integrated circuit must be de-capped to expose the top layer of the circuit in question, which is normally a metal layer. In step 10, the exposed layer is scanned under high magnification using a scanner 21 based on film, a digital camera, a scanning electron microscope (SEM) or an X-ray camera under the control of an operator using a processor 22 through an interface/monitor 26. It is preferred to use a SEM or some such device in order to attain the high magnification required, as well as to produce an electronic image, which is stored in memory 23 in step 11. Normally, the entire surface of the integrated circuit would have to be scanned. This is usually accomplished by producing a series of overlapping images that are stitched together electronically to form a single electronic mosaic image of the entire layer which is stored as per step 11. In step 12, the electronic image of the stored image representing the layer of the IC layout is transformed into a vector representation by converter 24. Once the entire layer or the desired portion of layer has been scanned, it is determined whether there is a further layer to be scanned in step 13. If that is the case, the previously scanned layer is removed to expose the next layer of the integrated circuit to be scanned and steps 10, 11 and 12 are repeated. This process continues for all of the layers required to analyse the IC. Once all of the layers have been scanned and stored electronically in vector format in memory 25, the layers are aligned vertically and horizontally in step 14 using the vector data of the layers. The layers are then overlayed in their proper sequence in step 15 to form a three dimensional vector image of the IC which may be viewed on interface/monitor 26 in step 16. Each layer may be represented by a different color or cross-hatching to facilitate the viewing of the different layers by an operator, which in turn will allow the operator to readily recognize circuit elements such as transistors, gates and even more complex circuits.

In step 17, schematics of the circuits are generated and stored in a schematic memory 27 using templates from a library 28, as will be described later. While the layers are being aligned or when the schematics are being generated, errors that may have occurred during the processing or acquisition stages will become evident to the operator step 18, these errors may be corrected in step 19 by manipulating the vector data.

Figure 3:
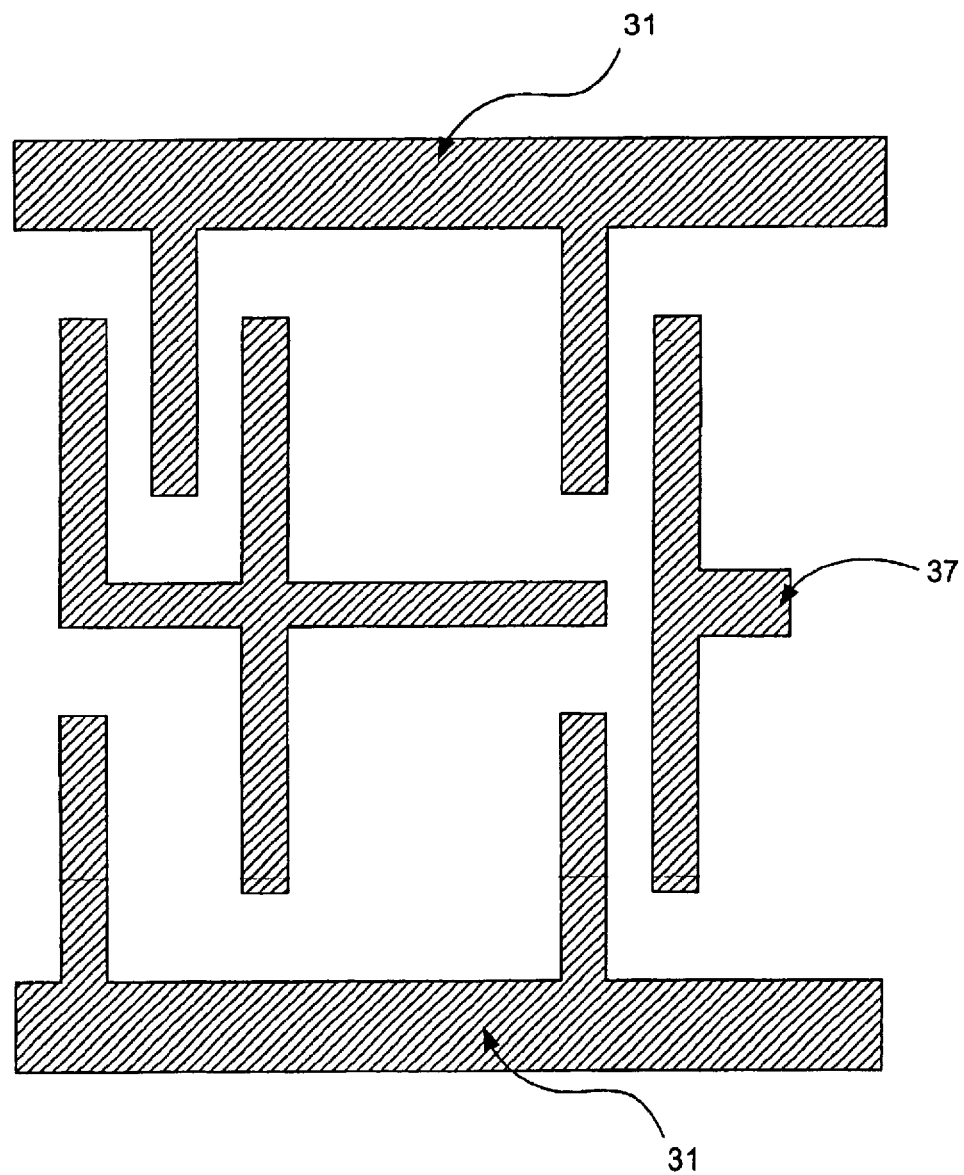
FIG. 3 is a digitized image of a metal overlying layer of an IC.

FIG. 3 shows the metal overlayer 31 of the de-capped circuit that has been scanned. A scanner normally cannot scan the full circuit being analyzed. It is necessary to methodically scan portions of the circuit forming many images and then bind or stitch them together in order to create large photomosaics. Some overlap between adjacent images is required when acquiring the images such that the operator, creating the photomosaic, will have a reference between each image. One layer will then be represented by multiple small images stitched together in order to have one photomosaic.

Figure 4:
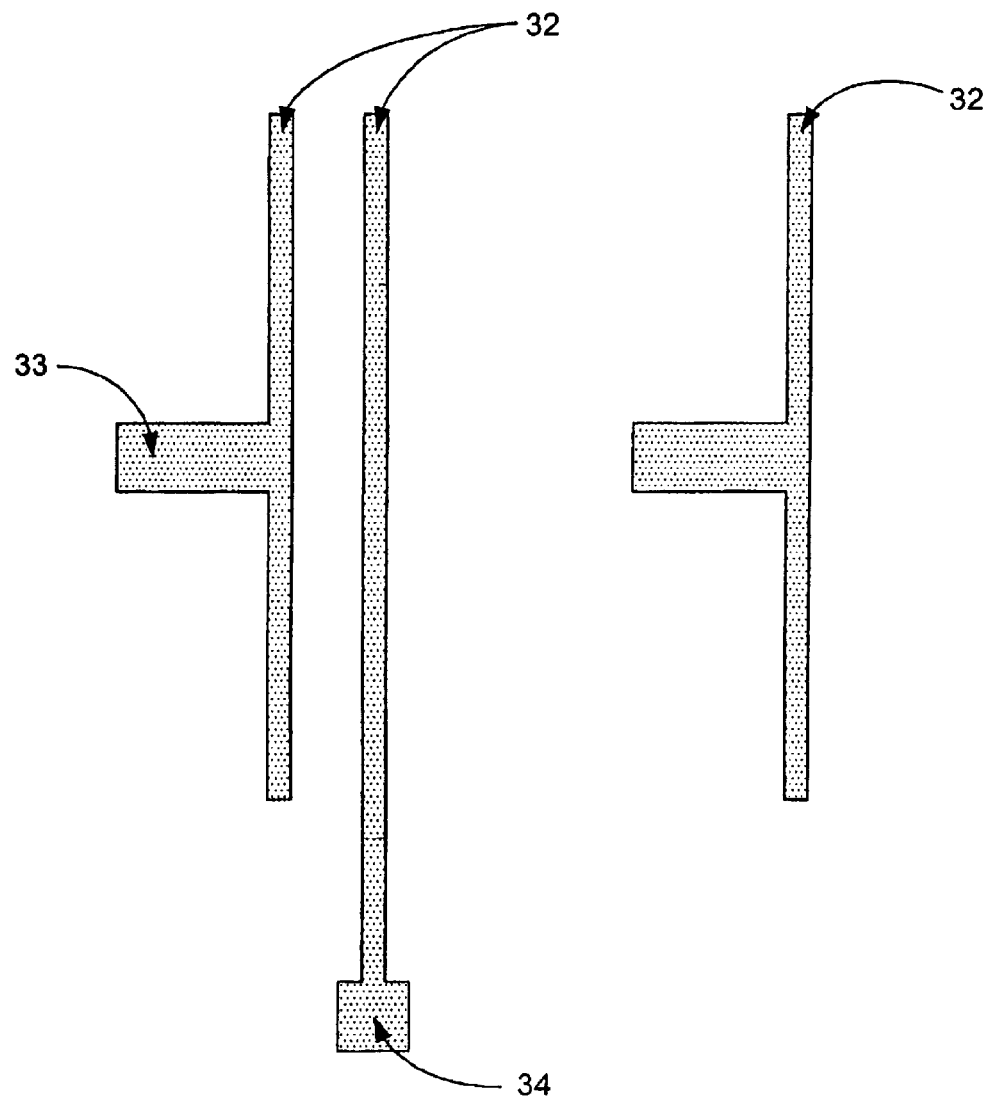
FIG. 4 is a digitized image of a polysilicon underlying layer of the IC.
Figure 5:
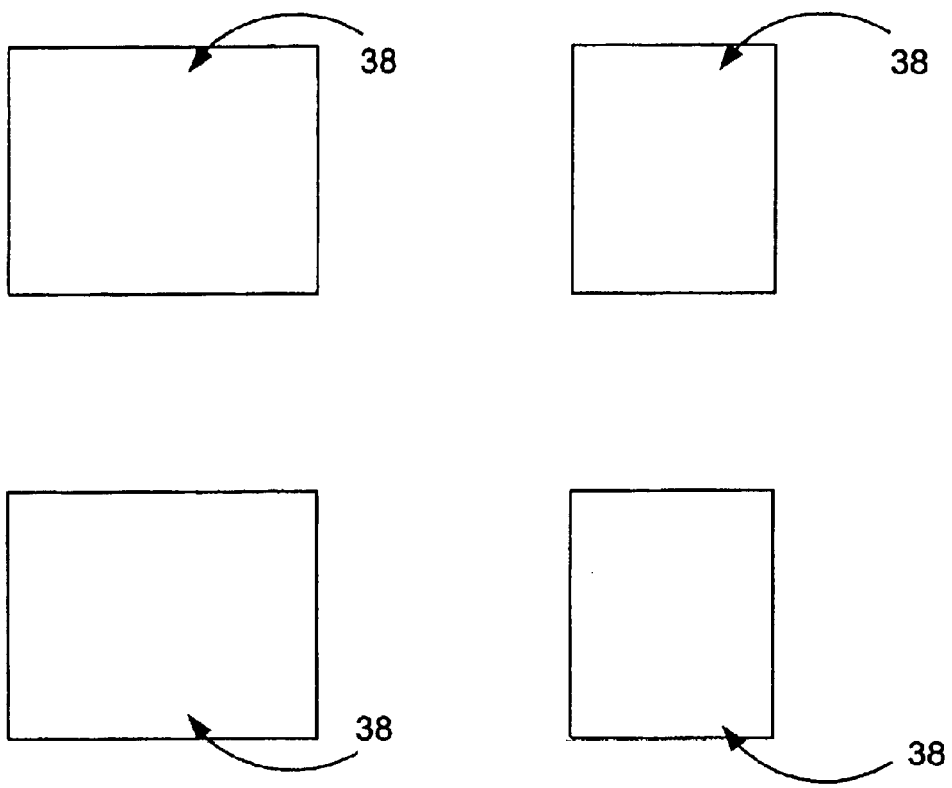
FIG. 5 is a digitized image of a doped diffusion underlying layer of the IC.

Each layer is removed by a delayering process, for example, after the metal layer 31 is imaged, it is removed from the circuit layout. FIG. 4 shows the image of the polysilicon layer 32 with metal layer 31 removed. FIG. 5 shows the image of the diffusion layer 38 that is scanned after the polysilicon layer has been removed by the delayering process. In prior art manual circuit extraction processes, the engineer would draw the metal layer 31 shown in FIG. 3 on top of the polysilicon image 32 shown in FIG. 4 for circuit extraction and analysis. In certain circumstances, the engineer may also to draw both the polysilicon layer 32 and the metal layer 31 on the diffusion layer 38. The example shown with regard to FIGS. 3 and 4 is not complex and the tracing of these diagrams can be done without making mistakes. The problem arises in more complex drawings where time and the tedious process involved become inherent burdens on the engineer.

Figure 6:
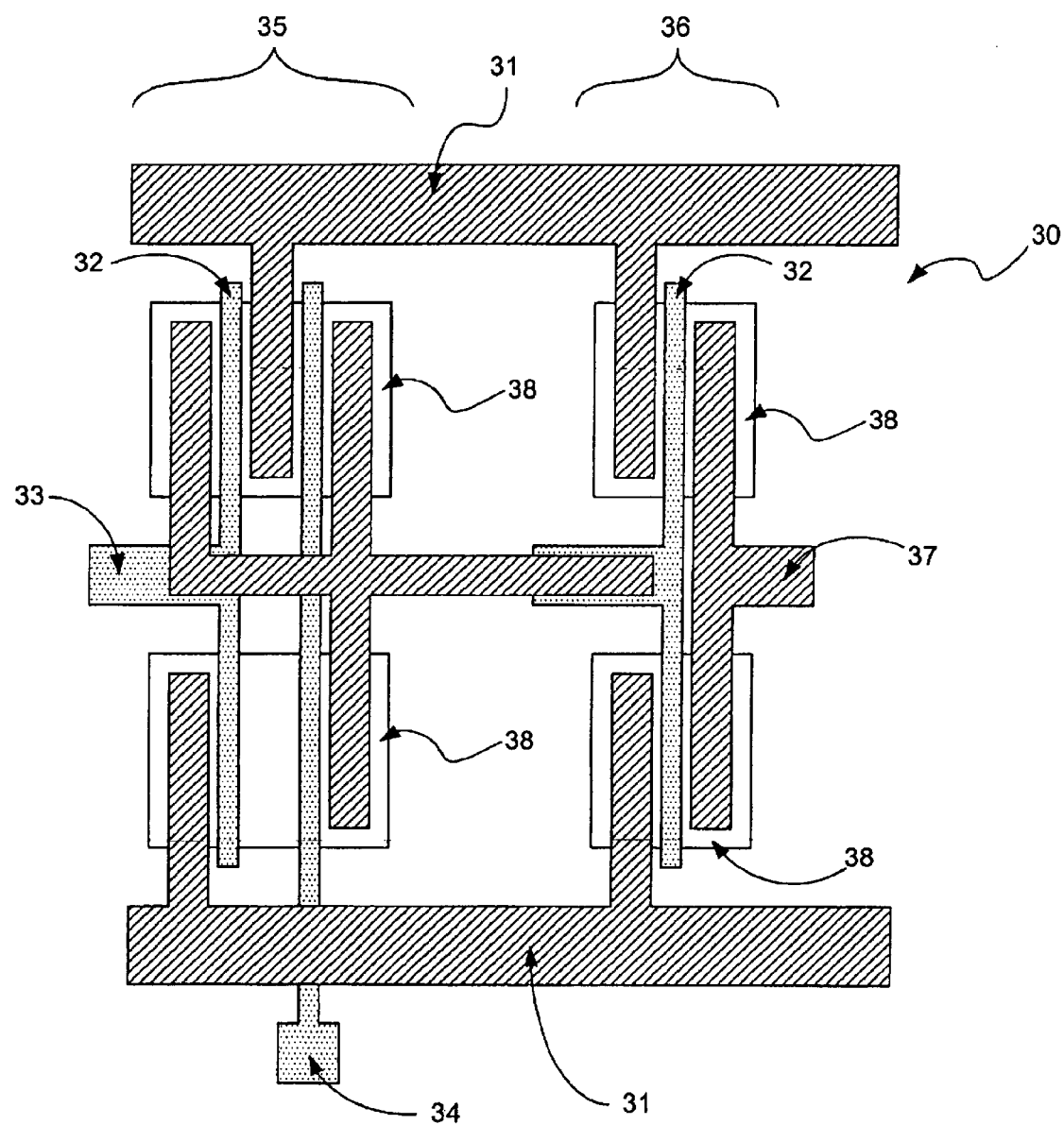
FIG. 6 is a top level image display of the circuit topography in accordance with the present invention.
Figure 7:
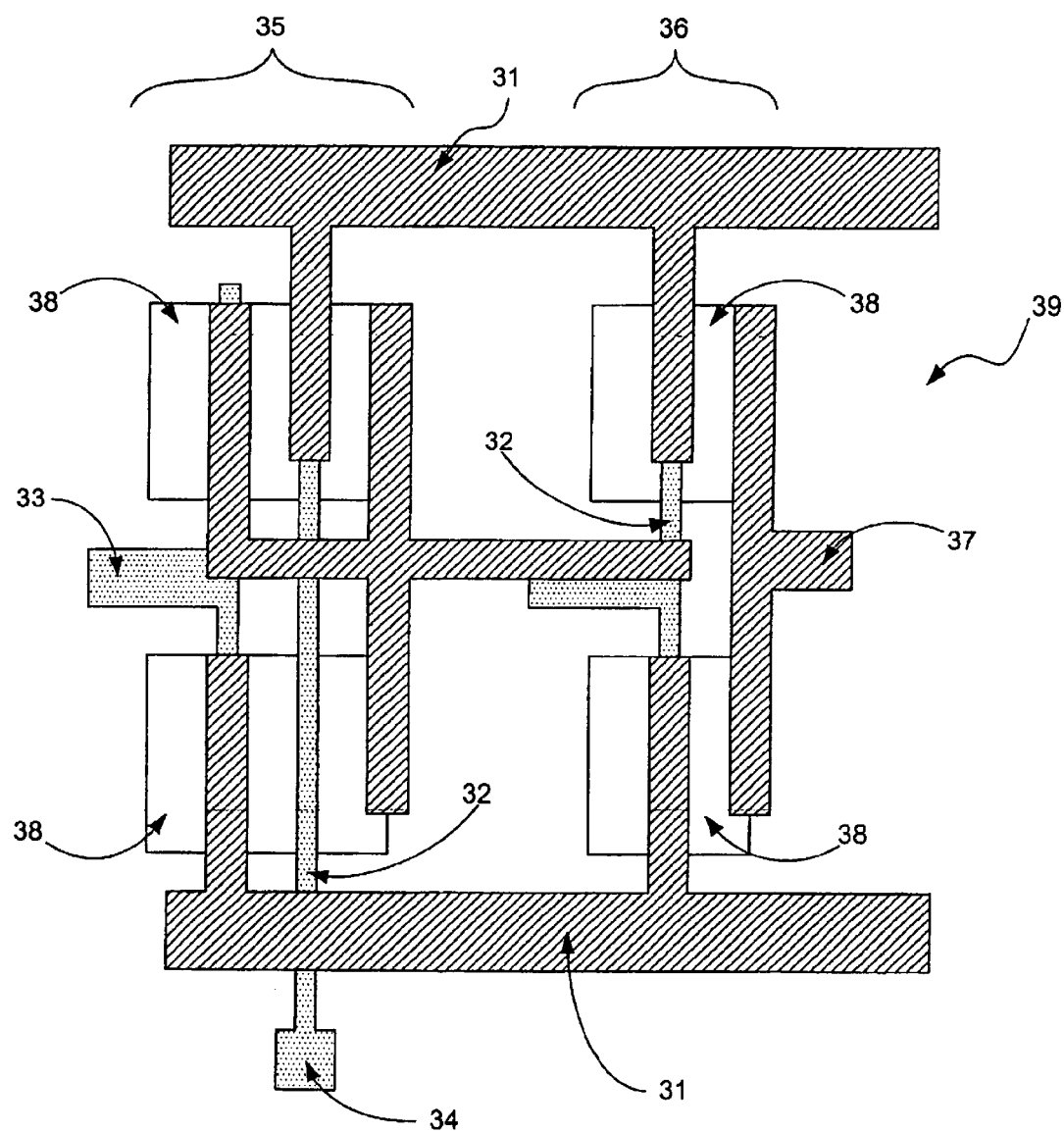
FIG. 7 is a top level image display of the circuit topography where the layer images are misaligned

FIG. 6 is an image of a circuit topography 30 which can be generated on the monitor 26 in accordance with the present invention. The three layers seen individually in FIGS. 3 to 5 are superimposed one over the other such that, from the top metal layer level, the metal overlayer 31, the polysilicon underlayer 32 and the further underlayer 38 of doped diffusion can be seen and recognized. It is evident from FIG. 7 that the metal layer 31 is misaligned with the polysilicon layer 32 since viable elements cannot be identified in image 39, whereas the association between the metal layer 31 and the polysilicon underlayer 32 in FIG. 6 can be recognized. Inputs 33 and 34 of a logic circuit NAND gate 35 on the polysilicon layer 32 can be identified. The output of a logic NOT gate 36 is seen on metal layer 31 as output 37. For simplicity of the diagrams, n-doped and p-doped diffusion layers are not distinguished, although these would be apparent to those skilled in the art.

An advantage of the present invention is the automated overlay of layers. Since the digital scanned images are converted from raster to vector format through a method of segmentation, the amount of data necessary for representing the digital images for storage and manipulation is reduced. The metal overlaying layer 31, the polysilicon underlying layer 32 and the diffusion layer 38 are aligned over one another allowing the user to view all of the layers in one image, which is displayed on monitor 26.

A further advantage of the present invention is that it permits the use of computer aided methods of image alignment. The operator can move two images into alignment by simply selecting similar overlapping features. Features such as vias connect the separate layers of the circuit. These features can easily be identified on two separate layers and aligned with each other. If image abnormalities are noticed, the user can manipulate or adjust the images with various techniques like stretching, skewing, scaling, flipping, or other features known in the art. A further advancement of this system allows not only for horizontal alignment between images of the same layer, but also allows for vertical alignment of layers such as metalization. Metal layers must be aligned horizontally with the same precision as images on the vertical level. The images of the system work together to represent the original three-dimensional layout of metal, polysilicon, and inter connective layers as close as possible. The exact alignment of layers is dependent on the exact de-processing and imaging of the die.

Figure 8:
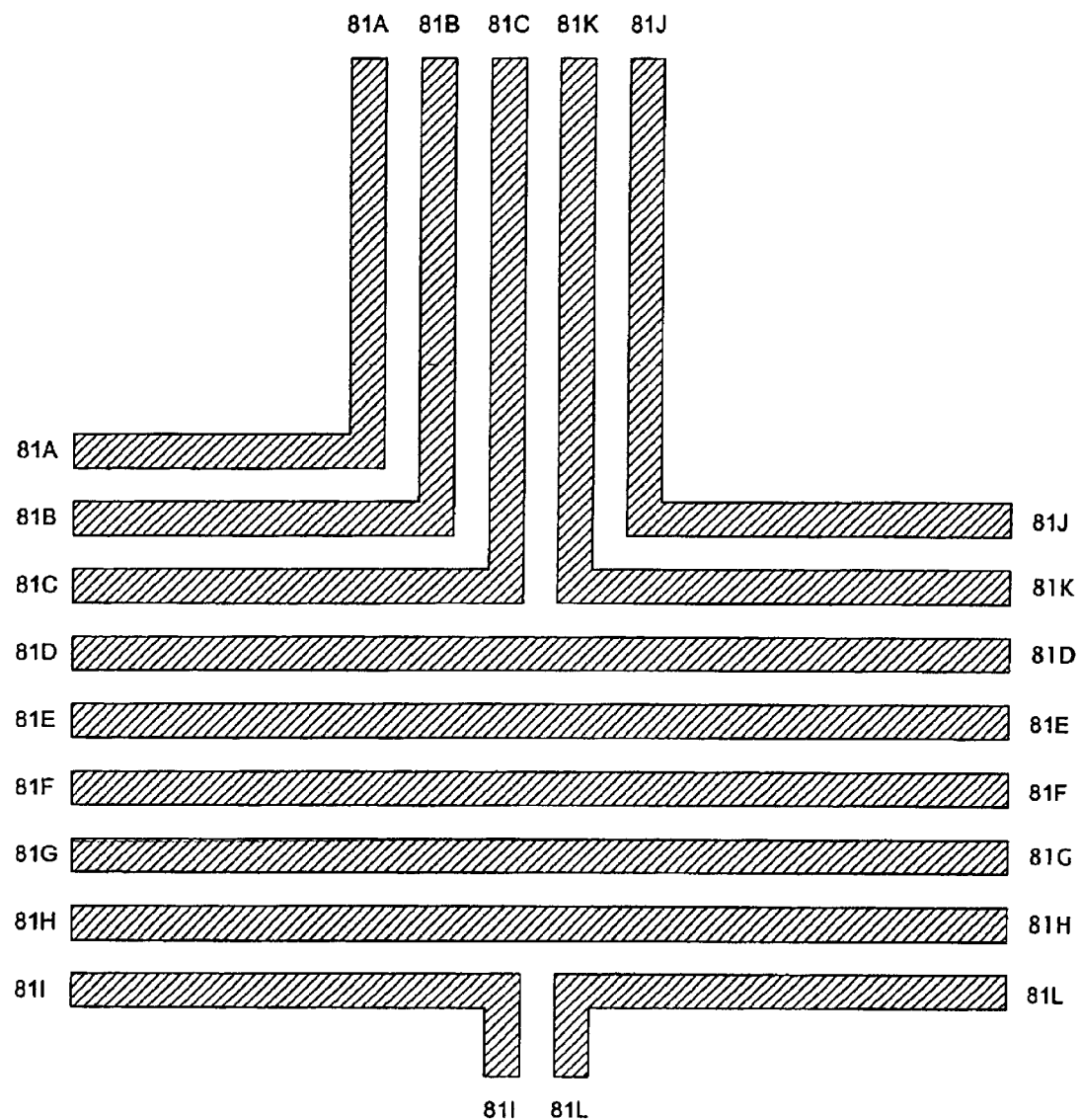
FIG. 8 is an example of a signal line routing structure of an IC.
Figure 9:
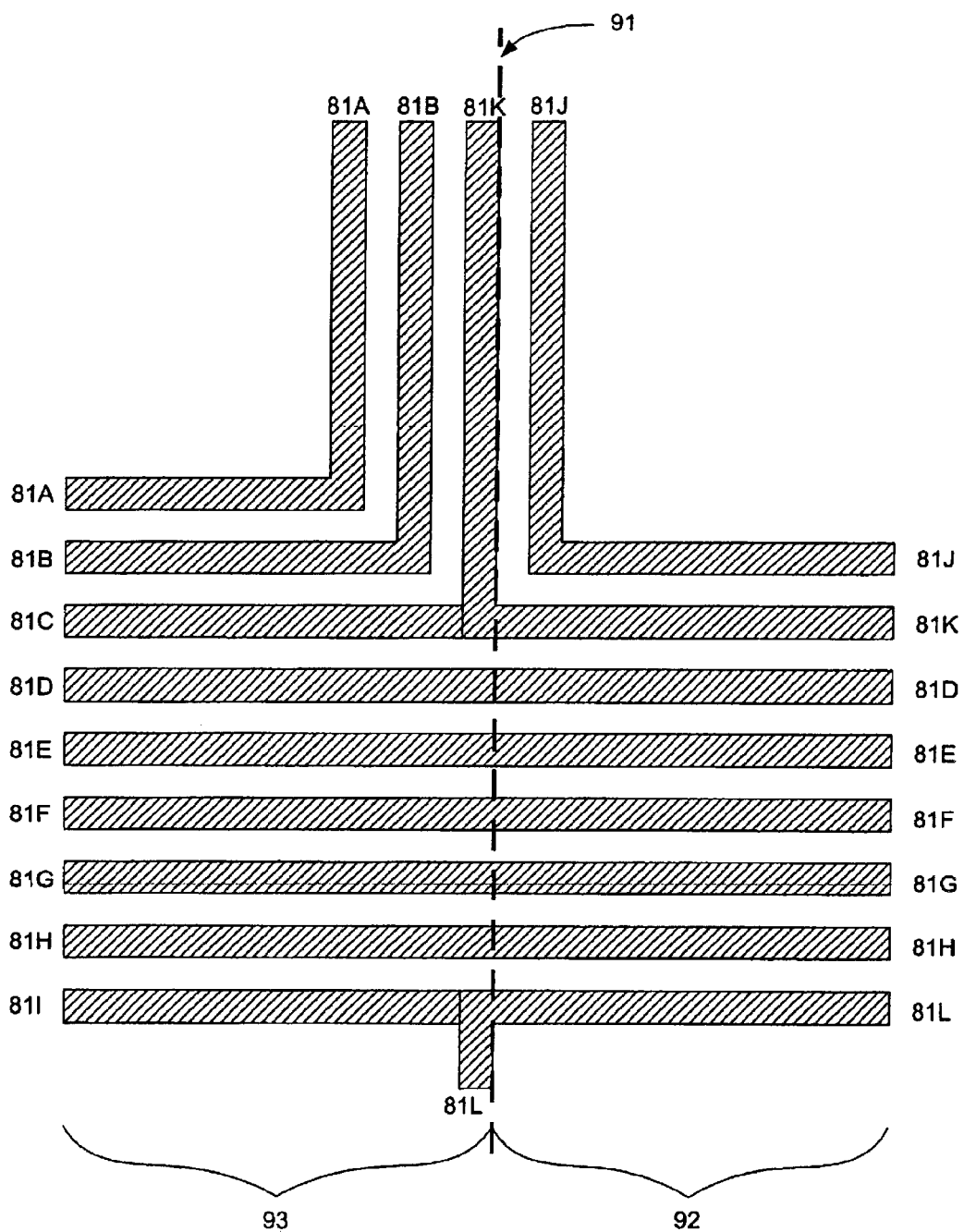
FIG. 9 is an example of an incorrect signal line routing structure of an IC.

FIG. 8 shows an example of signal routing lines that are labelled 81A–81L. This image may be composed of two or more images that have been properly stitched together. As shown in FIG. 9, the misalignment of two images 92 and 93 can create errors in circuit extraction. The seam between the two images 92 and 93 is illustrated by the dashed line 91. Image 92 has been shifted over image 93 by one signal routing line. Signals on the top and bottom of the images do not align. Signal 81I should not equal signal 81L, and signal 81C should not equal signal 81K. Without seeing the signal routing lines through a microscope, the engineer analyzing this circuit could interpret the misaligned signals lines as single lines. The use of SEM imaging allows for very detailed (<1 $\mu$m) alignment between separate images 92 and 93. The operator no longer has to physically match detail in the images to align them. Because of the inherent accuracy in the system, it can automatically arrange the images to form the photomosaics necessary.

The present invention further allows for the correction of problems arising from process or acquisition errors. Features that are missing from the vector representation of the circuit may be added. If metal lines are broken, or circuitry is not exact, the user can easily select, move, delete, add, cut, copy, or paste appropriate features to correct the error as would be done on a conventional image. This allows for full flexibility to mask any problems that may have occurred in the de-layering process.

Figure 11:
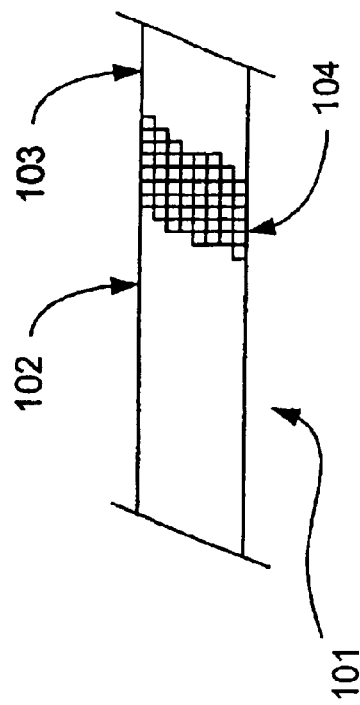
FIG. 11 is an example of an image with a repaired signal line.
Figure 10:
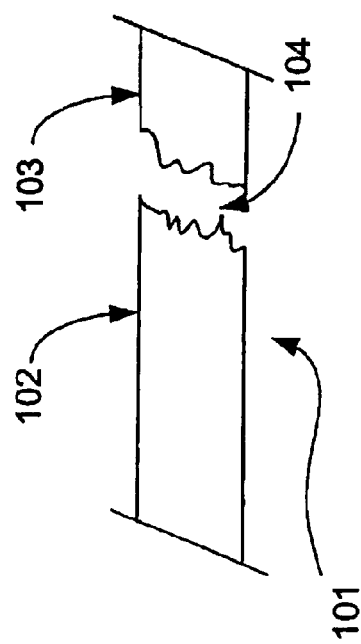
FIG. 10 is an example of a broken signal line in a delayered IC.

For example, as shown in FIG. 10, a line 101 may be broken into segments 102 and 103 by the de-layering process. An advantage of the present invention is the ability for the user to correct the broken section 104 digitally so the system can interpret the two segments 102 and 103 as a single signal line 101 as shown in FIG. 11.

Once the images of the layers are properly aligned and fixed, signal tracing is significantly improved. The advantage of changing the raster format to vector format is that the software can perform signal tracing. Vector format reduces the amount of data necessary to describe each line, thereby allowing the system to compare lines for connectivity. Each "signal line" can be associated with a specific name, thereby creating a signal list of all lines on the circuit. The user will no longer have to search through various physical photomosaics to find the connections between circuits. This system allows the user to click on a line, which the computer will then follow and highlight along with all its connected nodes. The system highlights these lines in a different color or fill pattern. An operator can then zoom in and out of the selected image to view the entire die area or a specific circuit. The algorithms used for line tracing are not detailed here since they are well known in the art.

A further advantage of digitized electronic images is that the user can always hide selected layers, such as a metal layer. This improves the ease with which logic gates can be identified. For example, a NAND gate normally does not require the user to see metalization higher than metal 1. Once the logic is identified, the other metal layers can be enabled to check for connectivity.

Figure 2:
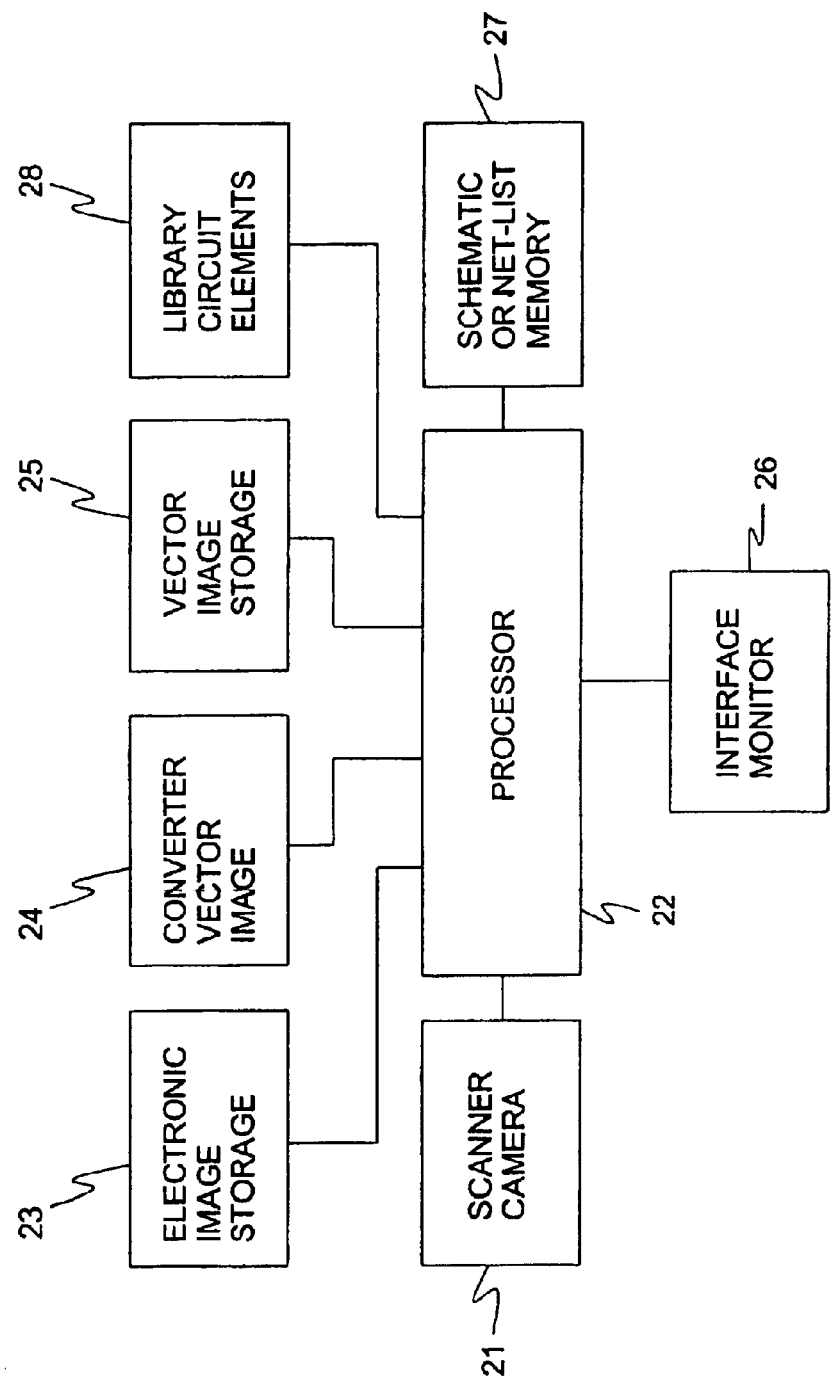
FIG. 2 is a schematic diagram of the apparatus in accordance with the present invention.
Figure 12:
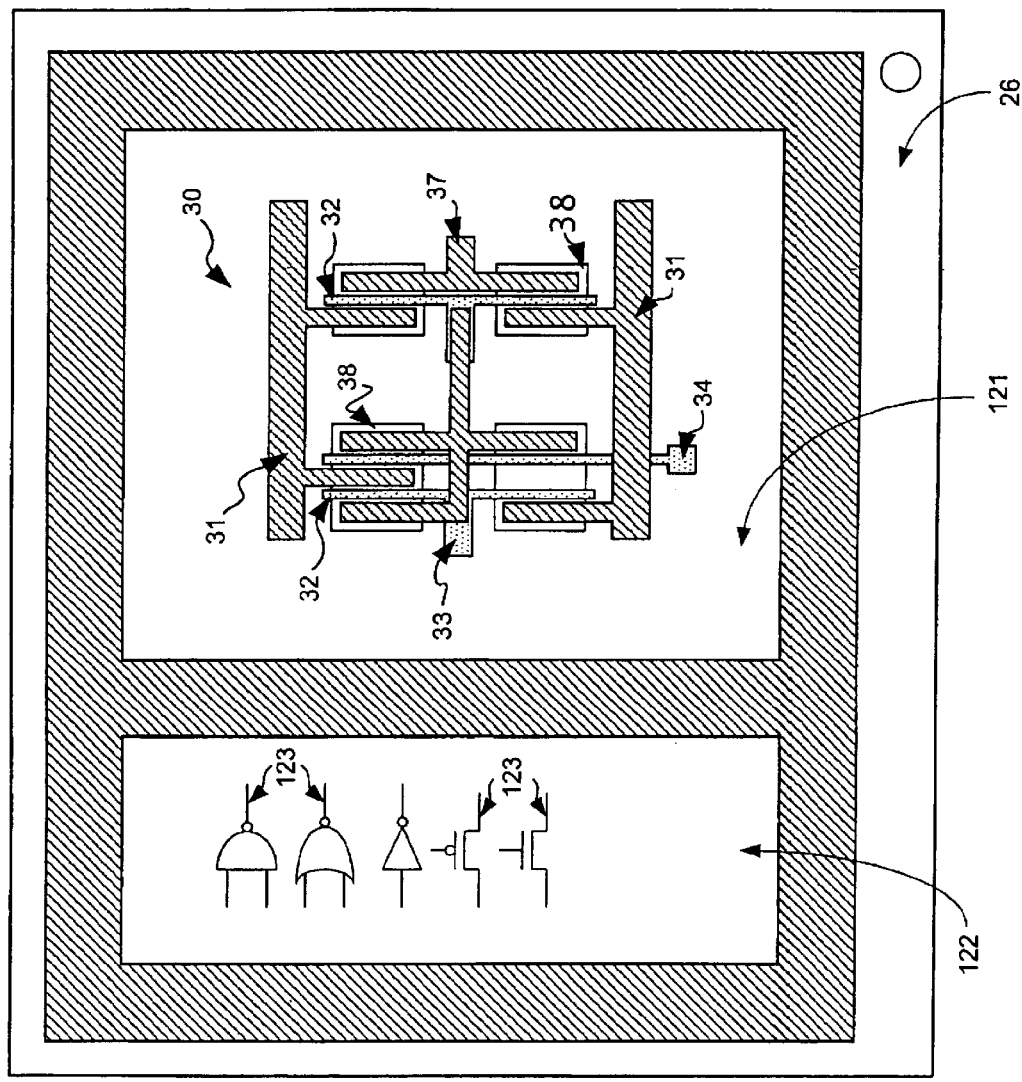
FIG. 12 illustrates the monitor display of an implementation of the present invention.
Figure 13:
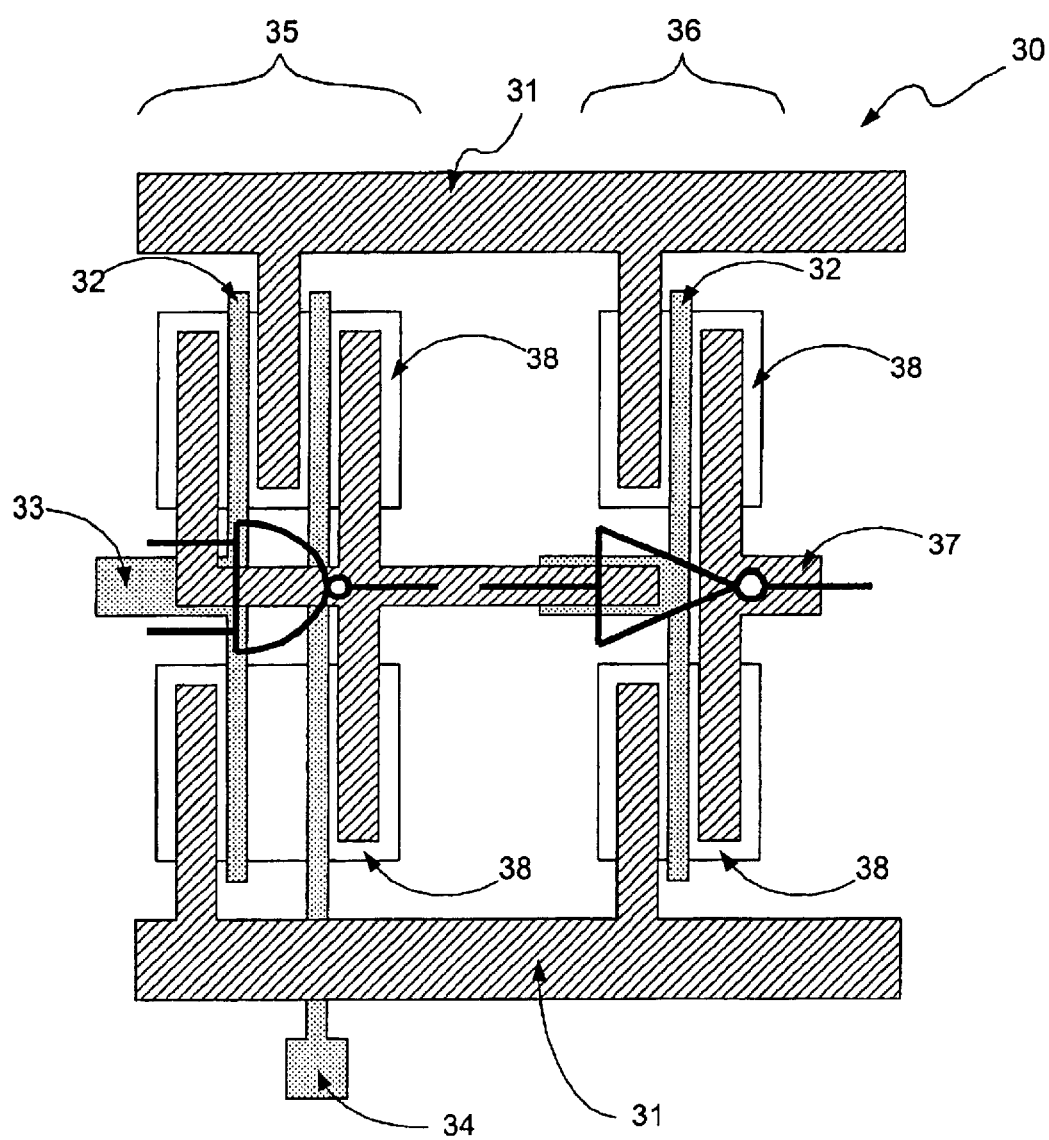
FIG. 13 is a representation of the top level image display of the circuit topography with circuit symbols superimposed.

As described with respect to step 17 in FIG. 1, schematics of the layout can be generated by identifying the elements using a symbol library. In particular, the application program displays the raster and/or vector representation 30 of the layers on one pane 121 of the monitor 26, as well as a library of gates and symbols 123 on another pane 122 of the monitor 26 as shown in FIG. 12. The library of gates and symbols 123 is common to most conventional digital or analog circuits. Circuit identification is performed by selecting the appropriate gate or symbol 123 from the library, and placing it on the appropriate image 30. The user then identifies the input and output connections 33, 34, 37 on the image 30. As seen in FIG. 13, the inputs of the NAND gate 35 are identified as 33 and 34, while the output of the NOT gate 36 is identified as 37. In conjunction with this example, the inputs and outputs of circuit 30 are then connected to the rest of the network through the net-list.

The net-list created describes the symbols 123 and their interconnections. A graphical representation of the net-list (schematic) can be created from the net-list by programs such as ViewLogic or Cadence. The advantage of the computer aided circuit extraction is that once the appropriate symbol is virtually placed on the image, the application automatically associates the lines and computes the connectivity of the symbol to the rest of the circuit. Although the application program automatically assigns names to nets in the schematic, the user can change the net names, such as CLK to identify a clock signal, and tag the appropriate line in the vector representation. This eliminates the conventional renaming of signals, and the effort spent in tracking connectivity of the circuit on the images.

The net-list, which contains the inputs, outputs, and type of logic used, created in accordance with the present invention is particularly advantageous. In the prior art system described in the above noted U.S. Pat. No. 5,999,726, one net-list is created to which all elements in a region of the sample and their connectivity are added. Analysis and organization of the single net-list is cumbersome, since no thought is given to functional divisions between sub-circuits. Each individual gate must be checked to find the source and the destination, and a decision must be made on which schematic page to place the circuitry. The present invention creates pages of net-lists. An engineer with experience in circuit extraction will recognize common areas, or circuits that should be common to a page of organized schematics. The invention also provides for the creation of logic blocks, such as latches or flip-flops, which can then be used in several schematics. The user selects the common transistors and gates to create such a logic block, defines the inputs and outputs, and creates a symbol of the block. A separate library of blocks can then be created. The user can select from both the common transistors and gates, or the blocks created, to drop these onto the image and connect to the nets as described above. FIG. 12 shows a monitor 26 view with a common transistor and symbol library on pane 122. Pane 122 can be changed to show other symbols that have been created, or to show both libraries simultaneously depending on the users preference.

In addition, the invention facilitates the user to create pages of circuits. Circuit schematics are divided into pages of common logic functionality. The combination of these pages create full circuits, for example, a memory array can be divided into row and column drivers along with the main memory. Further divisions into sub-systems such as redundancy, power generation, or input/output drivers shows the precise need to create multiple pages as the schematics are being extracted from the circuit. If a change is required, as an example if a gate must be moved from one page to another, the system will automatically update the corresponding net-list and associated schematics. The user simply updates the schematic by re-generating the circuit.

As described above, once schematics are generated, errors can be checked. If an operator notices a possible error in the schematic, the system can automatically trace the schematic to its associated circuit on the layout. Errors can be identified as improper functionality, dual sources for signals, I/Os missing, or any other error commonly found when performing circuit extraction. The user is then able to check connectivity, or selection of gates, to check if the original circuit extraction was correct. Since the connectivity is contained within the net-list, this error checking technique significantly speeds up the process compared to conventional manual circuit extraction.

The application program may be further implemented for multi-user interaction. In projects requiring multiple users, like those required by large circuits where a group is assigned to extract the schematic, a need arises to access circuits in different areas of the photomosaics. The flexibility of multiple users working on the same project can be implemented through a Local Area Network (LAN) where a central server application coordinates data flow between users working on common project files. All changes or additions to files are broadcast to other users, and local (in memory) copies of the files are updated with little or no delay.

The invention may be embodied in other specific forms without departing from the spirit or essential characteristics thereof. The present embodiments are therefore to be considered as illustrative and not restrictive, the scope of the invention being indicated by the appended claims rather then by the foregoing description, and all changes that come within the meaning and range of equivalency of the claims are therefore intended to be embraced therein.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of extracting circuit design information from a pre-existing semiconductor integrated circuit (IC), or at least a portion thereof, comprising the steps of:
   a. imaging at least a portion of two or more physical layers of the pre-existing IC to obtain stored electronic images of the physical IC layers;
   b. converting the stored electronic images of the physical IC layers to vector format data;
   c. horizontally and vertically aligning the vector format data of the stored electronic images of the physical IC layers, wherein the vertical aligning includes aligning corresponding images in different physical IC layers to form a three-dimensional vector image of the two or more aligned physical IC layers; and d. providing a multi-layer display of the three-dimensional vector image of the aligned physical IC layers.

2. A method of extracting circuit design information as claimed in claim 1 which further includes:

e. generating a net-list or schematic from the multi-layer display of the three-dimensional vector image.

3. A method of extracting circuit design information as claimed in claim 2 wherein each electronic stored image comprises two or more discrete overlapping images stitched together to form an image of the physical IC layer.

4. A method of extracting circuit design information as claimed in claim 2 wherein step e. comprises:

e.1. providing a template of circuit elements; and e.2. placing a circuit element over a portion of the display corresponding to the circuit element.

5. A method of extracting circuit design information as claimed in claim 4 wherein the template of circuit elements includes transistors and logic gates.

6. A method of extracting circuit design information as claimed in claim 4 wherein the template of circuit elements includes complex circuit blocks.

7. A method of extracting circuit design information as claimed in claim 2 wherein the method further comprises altering the vector data to correct errors in the images.

8. A method of extracting circuit design information as claimed in claim 7 wherein the method further comprises tracing a schematic to the image of the physical IC layer.

9. A method of extracting circuit design information as claimed in claim 2 wherein the method further includes manipulating the vector data to correct the alignment of the images.

10. A method of extracting circuit design information as claimed in claim 9 wherein the method further comprises tracing a schematic to the image of the physical IC layer.

11. A method of extracting circuit design information as claimed in claim 2 wherein step e. includes generating the net-list as a number of individual pages.

12. Apparatus for extracting circuit design information from a pre-existing semiconductor integrated circuit (IC), or at least a portion thereof, comprising:

means for imaging at least a portion of two or more physical layers of the pre-existing IC to obtain stored electronic images of the physical IC layers;

means for converting the stored electronic images of the physical IC layers to a vector format data;

means for horizontally and vertically aligning the vector data of the stored electronic images of the physical IC layers, wherein the means for vertically aligning includes means for aligning corresponding images in different physical IC layers to form a three-dimensional vector image of the two or more aligned physical IC layers; and means for providing a multi-layer display of the three-dimensional vector image of the aligned physical IC layers.

13. Apparatus for extracting circuit design information as claimed in claim 12 which further comprises:

means for generating a net-list or schematic from the multi-layer display of the three-dimensional vector image.

14. Apparatus for extracting circuit design information as claimed in claim 13 wherein each electronic stored image comprises two or more discrete overlapping images stitched together to form an image of the physical IC layer.

15. Apparatus for extracting circuit design information as claimed in claim 13 wherein the net-list or schematic generating means comprises:

means for providing a template of circuit elements; and means for placing a circuit element over a portion of the display corresponding to the circuit element.

16. Apparatus for extracting circuit design information as claimed in claim 15 wherein the template of circuit elements includes transistors and logic gates.

17. Apparatus for extracting circuit design information as claimed in claim 15 wherein the template of circuit elements includes complex circuit blocks.

18. Apparatus for extracting circuit design information as claimed in claim 15 which further comprises means for altering the vector data to correct errors in the images.

19. Apparatus for extracting circuit design information as claimed in claim 18 further comprising means for tracing a schematic to the image of the physical IC layer.

20. Apparatus for extracting circuit design information as claimed in claim 13 which further comprises means for manipulating the vector data to correct the alignment of the images.

21. Apparatus for extracting circuit design information as claimed in claim 20 which further comprises means for tracing a schematic to the image of the physical IC layer.

* * * * *